United States Patent
Lell et al.

(10) Patent No.: US 11,695,251 B2
(45) Date of Patent: Jul. 4, 2023

(54) LASER DIODE CHIP HAVING COATED LASER FACET

(71) Applicant: OSRAM Opto Semiconductors GmbH, Regensburg (DE)

(72) Inventors: Alfred Lell, Maxhütte-Haidhof (DE); Sebastian Taeger, Bad Abbach (DE); Sophia Huppmann, Geldersheim (DE)

(73) Assignee: OSRAM OLED GMBH, Regensburg (DE)

( * ) Notice: Subject to any disclaimer, the term of this patent is extended or adjusted under 35 U.S.C. 154(b) by 639 days.

(21) Appl. No.: 16/386,879

(22) Filed: Apr. 17, 2019

(65) Prior Publication Data

US 2019/0245323 A1    Aug. 8, 2019

Related U.S. Application Data (62) Division of application No. 15/118,041, filed as application No. PCT/EP2015/053218 on Feb. 16, 2015, now abandoned.

(30) Foreign Application Priority Data

Feb. 24, 2014  (DE) ............ 10 2014 102 360.9

(51) Int. Cl.
*H01S 5/028* (2006.01)
*H01S 5/024* (2006.01)

(52) U.S. Cl.
CPC ............ *H01S 5/0283* (2013.01); *H01S 5/028* (2013.01); *H01S 5/0281* (2013.01); *H01S 5/0282* (2013.01); *H01S 5/0287* (2013.01); *H01S 5/02469* (2013.01)

(58) Field of Classification Search
CPC ...... H01S 5/0283; H01S 5/028; H01S 5/0282; H01S 5/0284; H01S 5/0285; H01S 5/0286; H01S 5/0287; H01S 5/0288
See application file for complete search history.

(56) References Cited

U.S. PATENT DOCUMENTS

| | | |
|---|---|---|
| 4,317,086 A | 2/1982 | Scifres et al. |
| 4,905,245 A | 2/1990 | Ponjee et al. |
| 5,802,091 A | 9/1998 | Chakrabarti et al. |
| 5,851,849 A | 12/1998 | Comizzoli et al. |

(Continued)

FOREIGN PATENT DOCUMENTS

| | | |
|---|---|---|
| CN | 1874020 A | 12/2006 |
| DE | 102009058796 A1 | 6/2011 |

(Continued)

OTHER PUBLICATIONS

Ashurst, R.W. et al., "Vapor Phase Anti-Stiction Coatings for MEMS," IEEE Transactions on Device and Materials Reliablity, vol. 3., No. 4, Dec. 2003, pp. 173-178.

(Continued)

*Primary Examiner* — M. A. Golub-Miller
(74) *Attorney, Agent, or Firm* — Slater Matsil, LLP (57) ABSTRACT

A laser diode chip has a laser facet, which includes a coating. The coating includes an inorganic layer and an organic layer. In one example, the coating has a number of inorganic layers, including a heat-conductive layer. For example, the inorganic layers may form a reflection-increasing or reflection-decreasing layer sequence.

9 Claims, 4 Drawing Sheets

(56) References Cited

U.S. PATENT DOCUMENTS

| | | | |
|---|---|---|---|
| 6,396,864 | B1 | 5/2002 | O'Brien et al. |
| 6,727,520 | B2 | 4/2004 | Morgan et al. |
| 6,819,697 | B2 | 11/2004 | Widjaja et al. |
| 2002/0085610 | A1 | 6/2002 | Morgan et al. |
| 2005/0196972 | A1 | 9/2005 | Eder et al. |
| 2010/0014550 | A1* | 1/2010 | Hasegawa ............ H01S 5/0281 372/49.01 |
| 2011/0059307 | A1 | 3/2011 | Werner et al. |
| 2011/0180838 | A1 | 7/2011 | Sasaoka |
| 2012/0063483 | A1* | 3/2012 | Kameyama ............ H01S 5/028 372/49.01 |
| 2012/0140785 | A1* | 6/2012 | Nakagawa ............ B82Y 20/00 372/45.01 |
| 2014/0291658 | A1 | 10/2014 | Müller et al. |
| 2016/0365699 | A1 | 12/2016 | Lell et al. |

FOREIGN PATENT DOCUMENTS

| | | | |
|---|---|---|---|
| DE | 102011113428 | A1 | 3/2013 |
| JP | S63280486 | A | 11/1988 |
| JP | H01318272 | A | 12/1989 |
| JP | H03142892 | A | 6/1991 |
| JP | 4176180 | A | 6/1992 |
| JP | H06283811 | A | 10/1994 |
| JP | H10190120 | A | 7/1998 |
| JP | 2001119090 | A | 4/2001 |
| JP | 2003264333 | A | 9/2003 |
| JP | 2009277844 | A | 11/2009 |
| JP | 2010027863 | A | 2/2010 |
| JP | 2010532258 | A | 10/2010 |
| JP | 2011151310 | A | 8/2011 |
| JP | 2012015155 | A | 1/2012 |
| JP | 2012064886 | A | 3/2012 |
| JP | 6321197 | B2 | 5/2018 |
| TW | 200924234 | A | 6/2009 |
| WO | 2005053000 | A2 | 6/2005 |
| WO | 2009039354 | A2 | 3/2009 |
| WO | 2013161146 | A1 | 10/2013 |
| WO | 2014002339 | A1 | 1/2014 |

OTHER PUBLICATIONS

Dameron, A.A., et al., "Molecular Layer Deposition of Alucone Polymer Films Using Trimethylaluminum and Ethylene Glycol," Chem. Mater., vol. 20, Apr. 29, 2008, pp. 3315-3326.

Ito, S. et al., "AIGaInN violet laser diodes grown on GaN substrates with low aspect ratio," Physica Status Solidi (a), vol. 200, No. 1, Nov. 2003, pp. 131-134.

Kobrin, B. et al., "Durable Anti-Stiction Coatings by Molecular Vapor Deposition (MVD)," NSTI—Nanotech 2005, vol. 2, May 8-12, 2005, pp. 347-350.

Kümmler, V. et al., "Gradual facet degradation of (Al,In)GaN quantum well lasers," Applied Physics Letters, vol. 84, No. 16, Apr. 19, 2004, pp. 2989-2991.

Okayasu, M. et al., "Facet oxidation of InGaAs/GaAs strained quantum-well lasers," Journal of Applied Physics, vol. 69, Issue 12, Jun. 1991, pp. 8346-8351.

Schoedl, T., et al., "Facet degradation of (Al,In)GaN laser diodes," Phys. Stat. Sol. (a), vol. 201, No. 12, Sep. 2, 2004, pp. 2635-2638.

Theis, C. et al., "Wavelength Stability of DFB Lasers for Non-Hermetic Applications," 2001 Proceedings 51st Electronic Components and Technology Conference, May 29-Jun. 1, 2001, 5 pages.

* cited by examiner

LASER DIODE CHIP HAVING COATED LASER FACET

CROSS-REFERENCE TO RELATED APPLICATIONS

This is a divisional application of U.S. application Ser. No. 15/118,041, filed on Aug. 10, 2016 which is a national phase filing under section 371 of PCT/EP2015/053218, filed Feb. 16, 2015 which claims the priority of German patent application 10 2014 102 360.9, filed Feb. 24, 2014, each of which is incorporated herein by reference in its entirety.

TECHNICAL FIELD

The invention relates to a laser diode chip having at least one laser facet with a coating.

BACKGROUND

Laser diode chips capable of emitting in the UV spectral range, the visible spectral range or the infrared spectral range, for example, are used in many applications such as projection devices, in lighting technology or optical sensors, for example for gesture recognition.

Many laser diode chip applications utilize the achievable high optical power density. However, the high optical power density reached in laser diodes results in the light-emitting laser facet being particularly exposed to very high electric, optical and thermal loads. In particular, it turned out that oxidation of the laser facet may occur when operating the laser diode under the influence of moisture, the oxidation leading to a degradation of the laser diode chip. Furthermore, there is a risk of particles adsorbing at the laser facet as a result of the electrostatic interaction when operating the laser diode chip, what may lead to shadowing effects in the far field, a reduced slope of the laser characteristic curve or overheating of the mirror and even the catastrophic optical damage (COD, German: Zerstörung).

Further, high sensitivity of the laser facets requires very high efforts in the mounting of the laser diode chip.

SUMMARY

Embodiments of the invention provide a laser diode chip which is characterized by improved long term stability.

According to at least one embodiment, the laser diode chip has at least one laser facet with a coating. In particular, the laser facet forms one of the resonator mirrors of the laser diode chip. In particular, the laser diode chip may be an edge emitter laser diode chip in which the resonator mirror is formed by two laser facets located opposite to one another. In this case, preferably both laser facets each have one coating, where the coatings may be different from one another at least in their optical properties, particularly the reflectivity. Preferably, at least the laser facet of the laser diode chip serving as the radiation exit surface has the coating described herein.

In the laser diode chip, the coating of the at least one laser facet advantageously comprises at least one inorganic layer, preferably multiple inorganic layers, and at least one organic layer. In other words, the coating is an inorganic-organic hybrid structure.

The at least one inorganic layer contained in the coating may be a reflection-increasing or reflection-reducing layer, for example. In particular, the coating may contain multiple inorganic layers, which are at least partially contained in a reflection-reducing or reflection-increasing layer sequence. The reflectivity of the laser facet can specifically be adjusted by the reflection-increasing or reflection-decreasing layer or layer sequence.

Advantageously, at least one additional function of the coating may be realized by the at least one organic layer contained in the coating. In particular, the at least one organic layer may have the function of a protective layer, which particularly improves the long-term stability of the laser diode chip. The at least one organic layer particularly allows reducing the diffusion of moisture and the adsorption of particles. As a result, the inorganic-organic hybrid structure is characterized by an improved protection of the laser diode chip against degradation when compared to purely inorganic coatings.

The at least one inorganic layer of the coating is advantageously produced by atomic layer deposition (ALD), chemical vapor deposition (CVD), plasma enhanced chemical vapor deposition (PEVCD), ion beam deposition (IBD) or ion plating (IP).

The at least one organic layer is preferably produced by molecular vapor deposition (MVD) or molecular layer deposition (MLD). These deposition methods are particularly suitable for producing organic layers serving as a diffusion barrier. Furthermore, the at least one organic layer can be produced by a physical vapor deposition (PVD) method, a sol gel process or by dip coating, for example.

According to one embodiment, the at least one organic layer comprises a diffusion barrier layer. The organic diffusion barrier layer particularly forms a barrier for moisture and/or oxygen. This achieves reducing a degradation of the laser facet, particularly caused by oxidation.

Furthermore, the at least one organic layer provides the advantage of being relatively elastic when compared to inorganic dielectric layers, so that the organic layer is capable of elastic deformation in the case of operational temperature changes. This achieves reducing the risk of crack formation in the coating caused by thermally-induced stress.

The at least one organic layer, particularly the diffusion barrier layer, preferably contains an alkane, an alkene, an alkyne, a cycloalkane, a cycloalkene, a polyamide or an aluminum alkoxide.

According to an advantageous configuration, the at least one organic layer comprises an organic cover layer. In this configuration, the organic cover layer is the outmost layer of the coating adjacent to the surrounding medium.

Advantageously, the organic cover layer is a hydrophobic layer and/or a non-stick layer. In this case, the surface of the coating facing away from the laser facet preferably is hydrophobic and/or adhesion-inhibiting. Penetration of moisture and/or particle adsorption is advantageously reduced by the hydrophobic layer and/or the non-stick layer. Advantageously, the organic cover layer has a contact angle for water greater than 90°. The contact angle is a measure for the wettability of the surface with water.

The organic cover layer may particularly comprise carbon nanotubes, an organic fluorine or sulfur compound, a thiol or a silane. These materials are particularly suitable for the formation of a hydrophobic layer. Preferably, the organic cover layer is a monolayer, particularly a self-assembled monolayer (SAM).

In another preferred configuration, the organic cover layer contains a chlorosilane, an amine, an alcohol, a carbon acid, a siloxane or a dimethylamino silane. These materials are particularly suitable for formation of a non-stick layer. The non-stick layer is preferably applied by a molecular vapor deposition (MVD) method.

The water-repellent or adhesion-inhibiting property of the organic cover layer may depend on the material of the cover layer, particularly the chemical properties of the surface, and/or the structure thereof. In particular, the organic cover layer may have a surface structure by means of which a water-repellant effect, the so-called lotus effect, is achieved.

According to a preferred configuration, the at least one inorganic layer comprises a heat conductive layer. Advantageously, the heat conductive layer allows advantageously dissipating heat that develops during operation of the laser diode chip at the laser facet. Transparent conductive oxides such as ITO or ZnO are preferred materials for the heat conductive layer. Further preferred materials include GaN, AlN, diamond-like carbon (DLC), SiC or graphene. The heat conductive layer may particularly also be electrically conductive. This is why it is advantageous to not attach or apply the heat conductive layer directly to the laser facet, since otherwise there would be a short-circuit risk for the semiconductor layers of the laser diode chip.

In the case that the heat conductive layer has an electric conductivity as low as not to pose a risk of short circuits, the heat conductive layer may also be directly applied or attached to the laser facet. In this case, heat can be dissipated from the laser diode chip in a particularly good manner.

In a preferred configuration, the heat conductive layer is arranged between a first organic diffusion barrier layer and a second organic diffusion barrier layer. This is advantageous since the organic diffusion barrier layers are comparatively elastic and therefore capable of compensating a temperature-dependent expansion of the heat conductive layer preferably in the elastic expansion range.

In a preferred configuration, the at least one inorganic layer comprises a dielectric protective layer, which is directly adjacent to the laser facet. Preferably, the dielectric protective layer is a layer produced by atomic layer deposition. Atomic layer deposition allows producing especially dense layers, the dense layers particularly forming a diffusion barrier for moisture. The dielectric protective layer preferably comprises one oxide, nitride or oxynitride.

The coating may particularly comprise multiple inorganic layers. According to an advantageous configuration, the inorganic layers are at least partially arranged in a reflection-increasing or reflection-decreasing layer sequence. The reflection-increasing or reflection-decreasing layer sequence may particularly comprise alternating layers having a refractive index that alternates between higher and lower values.

The inorganic layers of the coating, particularly the reflection-increasing or reflection-decreasing layer sequence, preferably contain dielectric materials, particularly oxides, nitrides or oxynitrides. The inorganic layers may particularly comprise at least one of the materials $SiO_2$, $Al_2O_3$, $TiO_2$, $Ta_2O_5$, $Si_3N_4$, $ZrO_2$, $HfO_2$, $Nb_2O_5$, $Y_2O_3$, $Ho_2O_3$, $CeO_3$, $Lu_2O_3$, $V_2O_5$, HfZrO, MgO, TaC, ZnO, CuO, $In_2O_3$, $Yb_2O_3$, $Sm_2O_3$, $Nd_2O_3$, $Sc_2O_3$, $B_2O_3$, $Er_2O_3$, $Dy_2O_3$, $Tm_2O_3$, $SrTiO_3$, $BaTiO_3$, $PbTiO_3$, $PbZrO_3$, $Ga_2O_3$, HfAlO or HfTaO.

It is possible that the reflection-increasing or reflection-decreasing layer sequence consists exclusively of inorganic layers.

In a preferred configuration, the coating comprises a heat conductive layer arranged between a dielectric reflection-increasing or reflection-decreasing layer sequence and an organic diffusion barrier layer. In this case, the heat conductive layer is advantageously insulated from the laser facet by the dielectric reflection-increasing or reflection-decreasing layer sequence, which may therefore also comprise an electrically-conductive material.

In a preferred configuration, the reflection-increasing or reflection-decreasing layer sequence contains both inorganic and organic layers, particularly alternating inorganic and organic layers. The reflection-increasing or reflection-decreasing layer sequence may particularly comprise alternating inorganic layers having a high refractive index and organic layers having a low refractive index, or, as an alternative, alternating inorganic layers having a low refractive index and organic layers having a high refractive index. In this configuration, the inorganic and/or organic layers advantageously have a thickness between 1 nm and 350 nm, preferably between 5 nm and 200 nm, and particularly preferably between 10 nm and 100 nm.

The number of layers in the reflection-increasing layer sequence advantageously ranges between 2 and 50, particularly preferably between 4 and 20.

BRIEF DESCRIPTION OF THE DRAWINGS

In the following, the invention will be explained in greater detail by exemplary embodiments in conjunction to FIGS. 1 to 8.

Shown are in.

Equal or equivalent components are marked with the same reference numeral in the figures, respectively. The components shown as well as the proportions of the components amongst one another are not to be considered to be true to scale.

DETAILED DESCRIPTION OF ILLUSTRATIVE EMBODIMENTS

Figure 1:
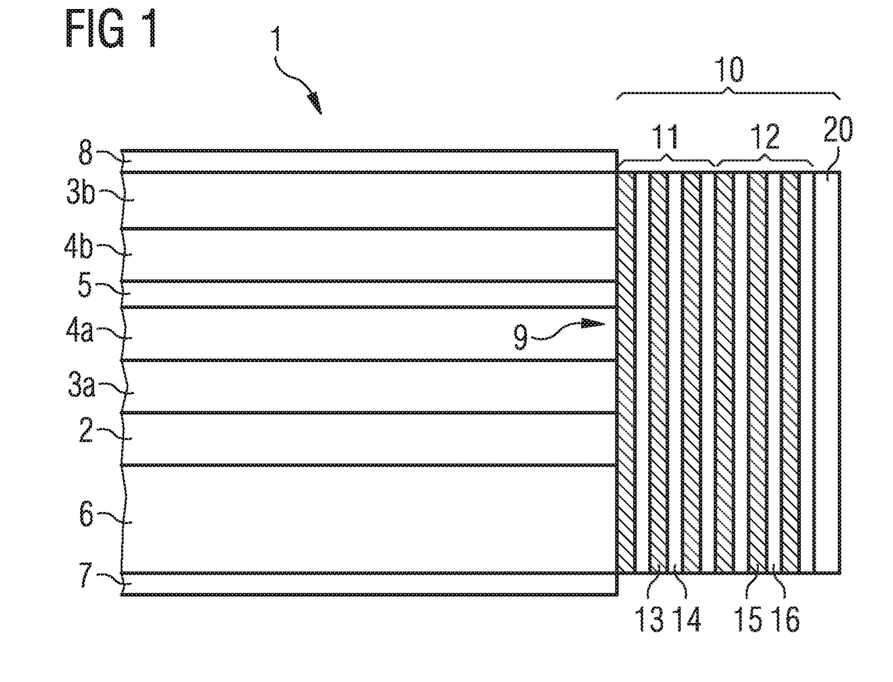
FIG. 1 a schematic illustration of a cross-section through a partial region of a laser diode chip according to a first exemplary embodiment, FIG. 2 a schematic illustration of a cross-section through a partial region of a laser diode chip according to a second exemplary embodiment, FIG. 3 a schematic illustration of a cross-section through a partial region of a laser diode chip according to a third exemplary embodiment, FIG. 4 a schematic illustration of a cross-section through a partial region of a laser diode chip according to a fourth exemplary embodiment, FIG. 5 a schematic illustration of a cross-section through a partial region of a laser diode chip according to a fifth exemplary embodiment, FIG. 6 a schematic illustration of a cross-section through a partial region of a laser diode chip according to a sixth exemplary embodiment, FIG. 7 a schematic illustration of a cross-section through a partial region of a laser diode chip according to a seventh exemplary embodiment, and FIG. 8 a schematic illustration of a cross-section through a partial region of a laser diode chip according to an eighth exemplary embodiment.

The laser chip diode 1 schematically shown in cross-section in FIG. 1 comprises a semiconductor layer sequence attached to a substrate 6.

For example, the semiconductor layer sequence contains a buffer layer 2 applied to the substrate 6, a first cladding layer 3a, a first waveguide layer 4a, an active layer 5, a second waveguide layer 4b and a second cladding layer 3b. The semiconductor layer sequence may contain further layers, which are not shown for simplification. Furthermore, at least partial regions of the semiconductor layer sequence may be structured, for example as a ridge waveguide structure. Suitable waveguide structures for laser diode chips are known per se and thus not shown in detail for simplification.

The active layer 5 of the edge-emitting semiconductor laser can be configured as pn-junction, double hetero structure, single quantum well structure or multi quantum well structure, for example. In the scope of the application, the term quantum well structure includes any structure in which charge carriers receive quantization of their energy states by confinement. In particular, the term quantum well structure does not contain information regarding the dimensionality of the quantization. Thus, it comprises, inter alia, quantum wells, quantum wires and quantum dots and any combination of these structures.

The semiconductor layer sequence of the laser diode chip 1 is preferably based on a III-V-compound semiconductor material, particularly on an arsenide, nitride or phosphide compound semiconductor material. For example, the semiconductor layer sequence may contain $In_xAl_yGa_{1-x-y}As$, $In_xAl_yGa_{1-x-y}N$ or $In_xAl_yGa_{1-x-y}P$, each with $0 \leq x \leq 1$, $0 \leq y \leq 1$ and $x+y \leq 1$. Here, the III-V-compound semiconductor material does not need to have a mathematically-exact composition according to one of the above formulas. It may rather comprise one or multiple dopants as well as additional components that do not substantially change the physical properties of the material. However, the above formulas do only contain the essential components of the crystal lattice for simplification, even though the components may be replaced by minor quantities of further materials.

Here, material selection is effected by the desired emission wavelength of the laser diode chip 1. The substrate 6 is selected by the preferably epitaxially-grown semiconductor sequence and may particularly comprise GaAs, sapphire, SiC, GaN or silicon.

For the electric contacting of the laser diode chip, a first contact layer 7 is arranged on a rear side of the substrate 6 facing away from the semiconductor layer sequence and a second contact layer 8 is arranged on the side of the semiconductor layer sequence facing away from the substrate 6.

The laser diode chip 1 comprises a laser facet 9 provided with a coating 10. The laser facet 9 can particularly form one of the resonator mirrors of the laser diode chip 1. A further laser facet, which is not shown in the detail and which is located opposite the laser facet 9 can form a second resonator mirror of the laser diode chip and be provided with a further coating, which may have the same advantageous configurations as the coating 10 of the laser facet 9 to be described in the following. In this case, the further coating does not need to be identical to the coating 10 but may have optical properties different from that of the coating 10, particularly a different reflectivity, for example.

The laser facet 9 provided with the coating 10 can particularly be provided as a radiation exit surface of the laser diode chip 1.

In the exemplary embodiment, coating 10 comprises a first reflection-increasing or reflection-decreasing layer sequence 11, which has multiple alternating first layers 13 and second layers 14. The reflection-increasing or reflection-decreasing layer sequence 11 in the exemplary embodiment has three layer pairs composed of first layers 13 and second layers 14, that is a total number of 6 layers. Generally, the number of layers 13, 14 is between 2 and 50, preferably between 4 and 20. For example, the alternating layers 13, 14 are inorganic dielectric layers respectively, which alternate between having a high refractive index or a low refractive index. The reflection-increasing or reflection-decreasing layer sequence 11 may have alternating first layers 13 made of $Al_2O_3$ and second layers 14 made of one of the materials $TiO_2$, $ZrO_2$ or $Ta_2O_5$, for example. In this configuration, the first layers each have a low refractive index and the second layers each have a high refractive index. As an alternative it is also possible for the first layers to have a high refractive index, the second layers having a low refractive index. Furthermore, the reflection-increasing or reflection-decreasing layer sequence 11 may also have or comprise an uneven number of layers, i.e., a further layer with a low or high refractive index is contained in the layer sequence 11 in addition to the layer pairs.

In the exemplary embodiment, coating 10 further comprises a second reflection-increasing or reflection-decreasing layer sequence 12, which is composed of alternating third layers 15 and fourth layers 16, which just like in the first reflection-increasing or reflection-decreasing layer sequence 11, advantageously have alternating low refractive indices and high refractive indices. Use of two successive reflection-increasing or reflection-decreasing layer sequences 11, 12 may be appropriate, for example to adjust the material of the first reflection-increasing or reflection-decreasing layer sequence ii with respect to the thermal expansion coefficient to the adjacent semiconductor material of the laser diode chip. The materials of the second reflection-increasing or reflection-decreasing layer sequence 11 may be selected for obtaining a most great difference in their refractive indices, for example.

However, as an alternative, it is also possible that coating 10 only contains one reflection-increasing or reflection-decreasing layer sequence 11. It is also possible that a reflection-increasing or reflection-decreasing single layer is used instead of the first and/or second reflection-increasing or reflection-decreasing layer sequence 11, 12.

It is not mandatory for the first reflection-increasing or reflection-decreasing layer sequence 11 or the second reflection-increasing or reflection-decreasing layer sequence 12 to consist exclusively of inorganic layers. As an alternative, it is rather also possible that at least one of the reflection-increasing or reflection-decreasing layer sequences 11, 12 comprises alternating inorganic and organic layers. In one configuration, the first reflection-increasing or reflection-decreasing layer sequence 11 comprises organic first layers 13 and inorganic second layers 14, for example. In this configuration, the organic layers 13 integrated in the reflection-increasing or reflection-decreasing layer sequence 11 provide the advantage that they are comparatively elastic when compared to inorganic dielectric layers. This is particularly advantageous if temperature-dependent stress occurs during operation of the laser diode 1.

Furthermore, coating 10 advantageously comprises a cover layer 20, which is a hydrophobic organic layer in the exemplary embodiment of FIG. 1. The hydrophobic organic cover layer 20 has a contact angle for water greater than 90°. The hydrophobic organic cover layer 20 particularly serves for protection of the laser facet 9 against moisture. The hydrophobic organic cover layer 20 may contain carbon nanotubes, organic fluorine or sulfur compounds, which in particular contain thiol or silane groups. The hydrophobic organic cover layer 20 preferably is a monolayer, particularly a self-assembled monolayer.

Figure 2:
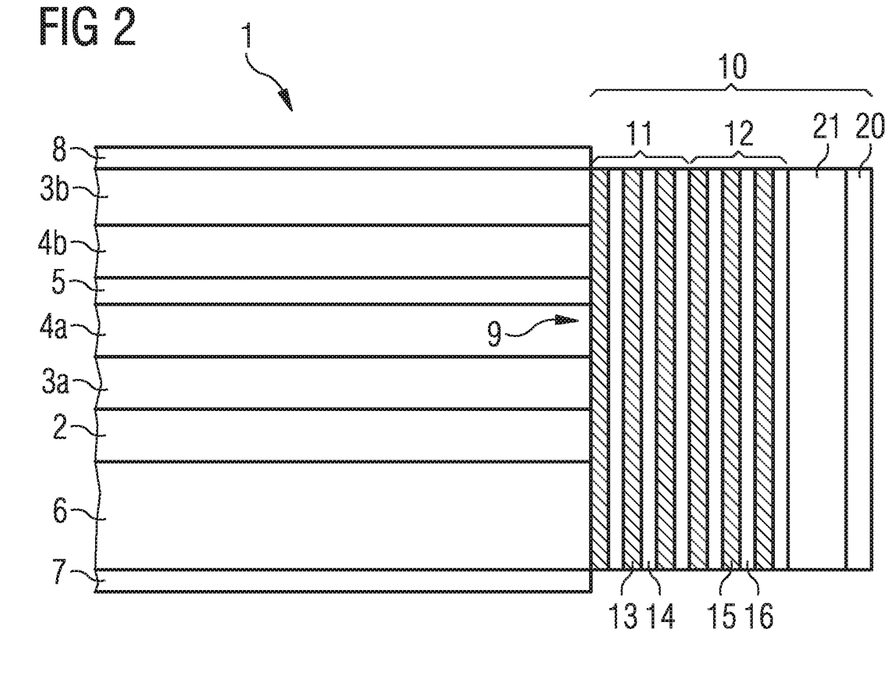

FIG. 2 illustrates a second exemplary embodiment of the laser diode chip 1. This embodiment is different from the first exemplary embodiment in that the an organic layer follows the second reflection-increasing or reflection-decreasing layer sequence 12 in the growth direction of the layer 10, which particularly is a diffusion barrier layer 21 for reducing the diffusion of oxygen or moisture. As a result, the laser facet 9 is even better protected against oxidation.

The organic diffusion barrier layer 21 preferably contains an alkane, alkene, alkyne, a cycloalkane, cycloalkene, a polyamide or an aluminum alkoxide. Apart from that, the second exemplary embodiment corresponds to the above described first exemplary embodiment.

Figure 3:
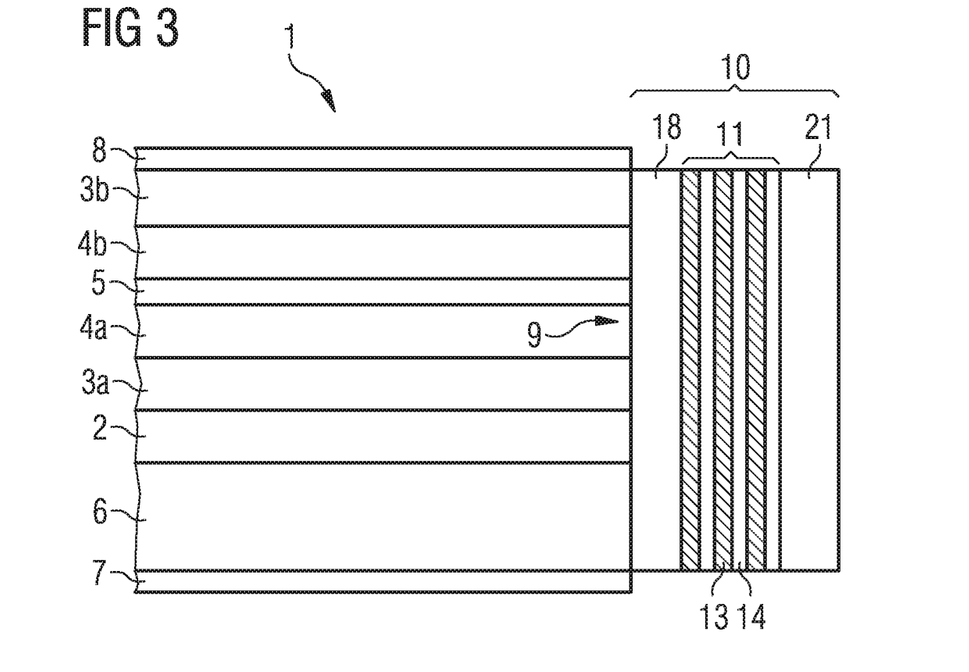

In the third exemplary embodiment shown in FIG. 3, a coating 10 is applied to the laser facet 9, which comprises, starting from the laser facet 9, a dielectric protective layer 18, a reflection-increasing or reflection-decreasing layer sequence 11 and an organic diffusion barrier layer 21. Advantageously, the dielectric protective layer 18 is directly adjacent to the laser facet 9 and preferably is a layer produced by atomic layer deposition. Atomic layer deposition allows depositing especially dense dielectric layers, the layers providing an especially good protection against the penetration of moisture. The dielectric protective layer preferably comprises an oxide, nitride or oxynitride. The dielectric protective layer 18 may comprise $SiO_2$, $Si(O_xN_{1-x})_2$, $Al_2O_3$ or $Al_2(O_xN_{1-x})_3$ or combinations thereof, for example.

The reflection-increasing or reflection-decreasing layer sequence 11 following the dielectric protective layer 18 corresponds to the first exemplary embodiment regarding the advantageous configurations thereof.

As in the second exemplary embodiment, the organic layer 21 may serve particularly as a diffusion barrier. In this exemplary embodiment, it simultaneously forms the cover layer of the coating 10. The organic diffusion barrier layer 21 provides the advantage that it is comparatively elastic and thus particularly tear-resistant when compared to inorganic layers. This reduces the risk that cracks occur in the diffusion barrier layer 21 during operation of the laser diode chip 1, for example caused by temperature-dependent stress.

Figure 4:
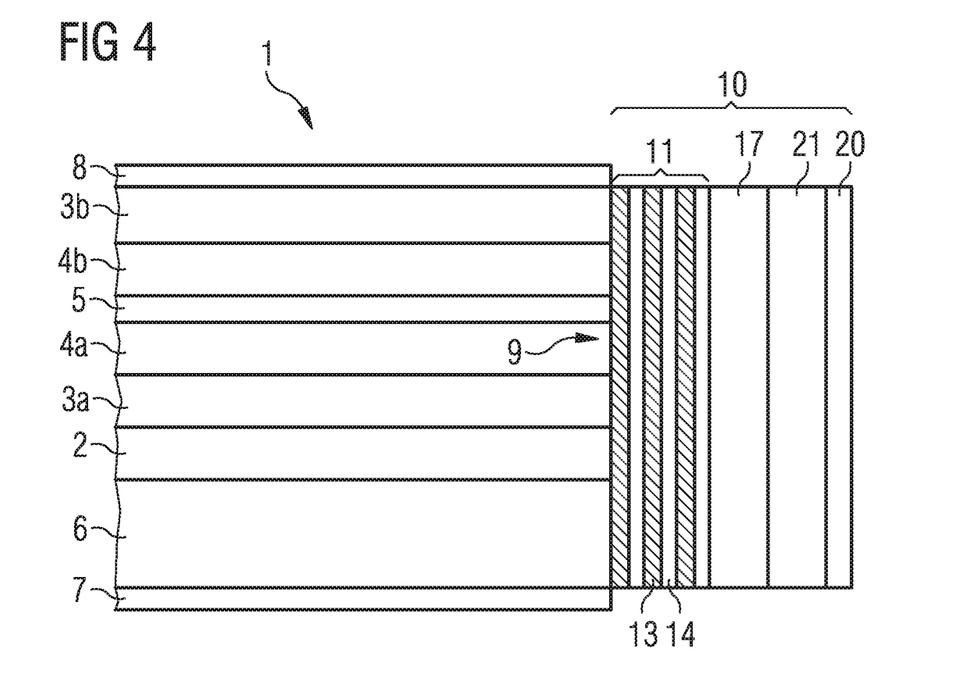

In the fourth exemplary embodiment shown in FIG. 4, a coating 10 is applied to the laser facet 9, the coating comprising, starting from the laser facet 9, a reflection-increasing or reflection-decreasing layer sequence 11, a heat-conductive layer 17, diffusion barrier layer 21 and a hydrophobic organic layer 20 as a cover layer.

This exemplary embodiment is different from the above described second exemplary embodiment in that the heat-conductive layer 17 is advantageously arranged between the reflection-increasing or reflection-decreasing layer sequence 11 and the organic diffusion barrier layer 21, making it possible to dissipate at least part of the heat developing during operation of the laser diode chip 1 through the layer 17. The heat-conductive layer 17 may particularly also comprise an electrically-conductive material, since it is insulated from the semiconductor layer sequence of the laser diode 1 by the dielectric reflection-increasing layer sequence 11. The heat-conductive layer 17 may contain ITO, ZnO, GaN, AlN, diamond-like carbon (DLC), SiC or graphene, for example.

Figure 5:
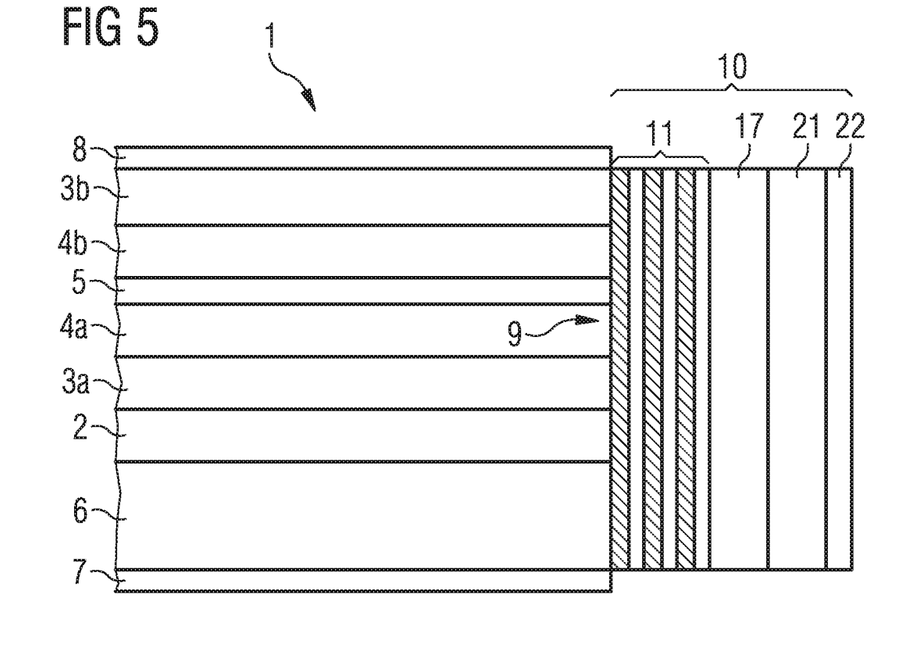

The fifth exemplary embodiment shown in FIG. 5 is different from the fourth exemplary embodiment in that an organic non-stick layer 22 is contained in the coating 10 as cover layer in place of the hydrophobic organic cover layer. Advantageously, the non-stick layer 22 reduces adsorption of particles at the laser facet. Otherwise, such particle adsorption could occur as a consequence of the electrostatic interactions during operation of the laser diode chip 1.

Preferably, the non-stick layer 22 is applied by an MVD method or an MLD method and preferably contains a chlorosilane, an amine, an alcohol, a carbon acid, a siloxane or a dimethylamino silane.

Figure 6:
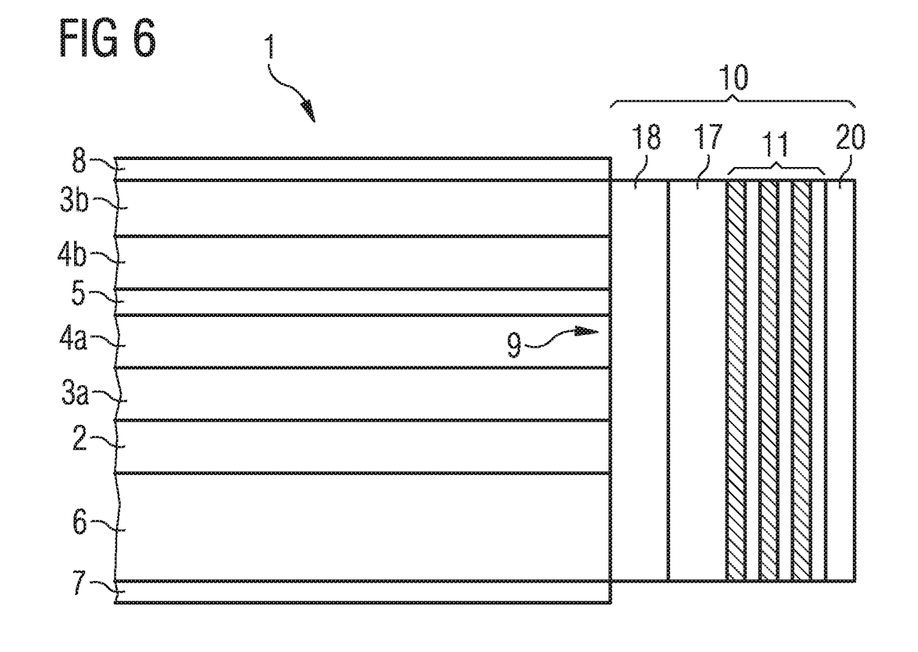

In the sixth exemplary embodiment shown in FIG. 6, the coating 10 comprises, starting from the laser facet 9, a dielectric protective layer 18, a heat conductive layer 17, a reflection-increasing or reflection-decreasing layer sequence 11 and a hydrophobic organic layer 20 as cover layer. The functions and advantageous configurations of the individual layers correspond to the exemplary embodiments described above and will thus not be explained in further detail.

Figure 7:
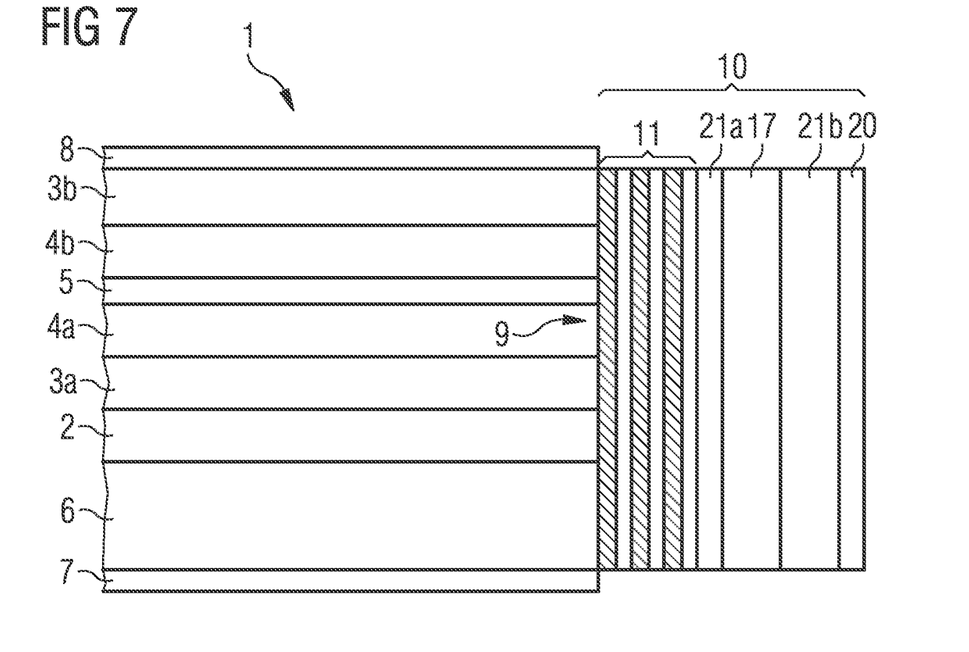

In the seventh exemplary embodiment shown in FIG. 7, the coating 10 comprises, starting from the laser facet 9, a reflection-increasing or reflection-decreasing layer sequence 11, a first organic diffusion barrier layer 21a, a heat-conductive layer 17, a second organic diffusion barrier layer 21b and a hydrophobic organic cover layer 20. In this exemplary embodiment, the heat-conductive layer 17 is arranged between two organic diffusion barrier layers 21a, 21b, the latter being elastic and thus being capable of compensating a temperature-dependent expansion of the heat-conductive layer 17 preferably in the elastic expansion range. The functions and advantageous configurations of the individual layers correspond to the exemplary embodiments described above and will thus not be explained in further detail.

Figure 8:
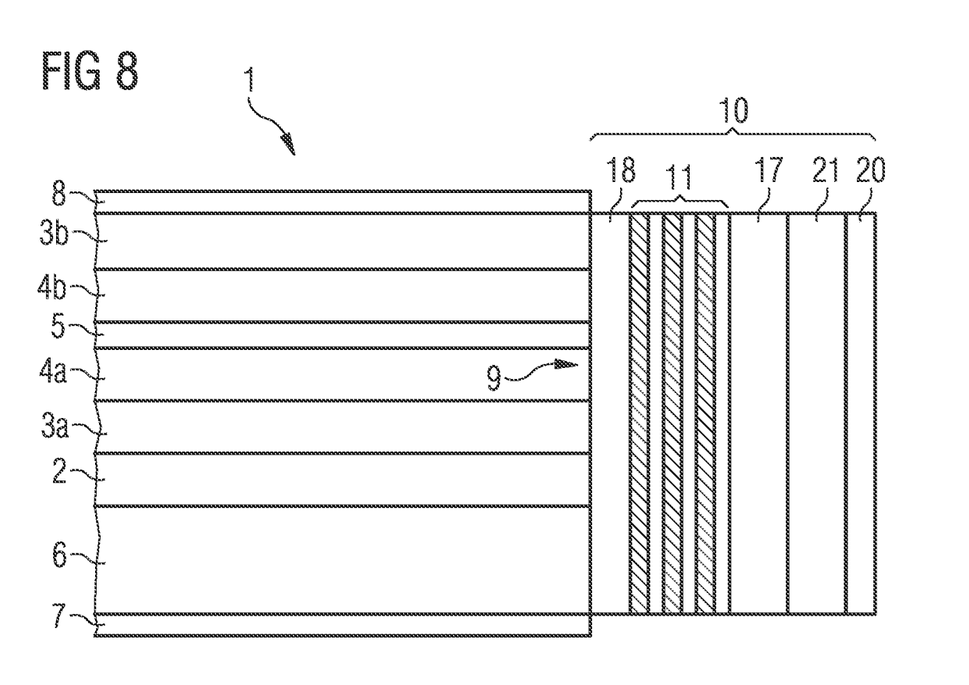

In the other exemplary embodiment shown in FIG. 8, the coating comprises, starting from the laser facet 9, a dielectric protective layer 18, a reflection-increasing or reflection-decreasing layer sequence 11, a heat-conductive layer 17, an organic diffusion barrier layer 21 and a hydrophobic organic layer 20 as a cover layer. In place of the hydrophobic organic cover layer 20, an organic non-stick layer could serve as cover layer just as well. The functionality of the individual layers corresponds to the exemplary embodiments described above and will thus not be explained in further detail.

The invention is not limited by the description with reference to the exemplary embodiments. The invention rather comprises each and every new feature as well as any combination of features, which particularly includes any combination in the patent claims, even though the feature or the combination is not explicitly stated in the patent claims or exemplary embodiments.

What is claimed is:

1. A laser diode chip comprising:
    at least one laser facet having a coating;
    wherein the coating comprises inorganic layers and organic layers, the inorganic layers comprising a heat-conductive layer, the organic layers comprising a first organic diffusion barrier layer and a second organic diffusion barrier layer, and the organic layers further comprising a first organic layer;
    wherein the heat-conductive layer is arranged between the first organic diffusion barrier layer and the second organic diffusion barrier layer;
    wherein the heat-conductive layer comprises at least one of a transparent conductive oxide, indium tin oxide (ITO), zinc oxide (ZnO), gallium nitride (GaN), aluminum nitride (AlN), diamond-like carbon (DLC), silicon carbide (SiC), or graphene; and
    wherein the inorganic layers comprise a reflection-increasing layer sequence or reflection-decreasing layer sequence, and wherein the heat-conductive layer, the first organic diffusion barrier layer, and the second organic diffusion barrier layer are arranged between the reflection increasing layer sequence or reflection decreasing layer sequence and the first organic layer.

2. The laser diode chip of claim 1, wherein the first organic layer is an organic cover layer and is a monolayer.

3. The laser diode chip according to claim 1, wherein the first organic diffusion barrier layer and the second organic diffusion barrier layer of the coating are each selected from a group consisting of an alkane, alkene, alkyne, a cycloalkane, cycloalkene, a polyamide or an aluminum alkoxide.

4. The laser diode chip according to claim 1, wherein the first organic layer of the coating comprise an organic cover layer.

5. The laser diode chip according to claim 4, wherein the organic cover layer is a hydrophobic layer or a non-stick layer.

6. The laser diode chip according to claim 5, wherein the organic cover layer has a contact angle for water greater than 90 degrees.

7. The laser diode chip according to claim 4, wherein the organic cover layer is selected from a group consisting of carbon nanotubes, an organic fluorine or sulfur compound, a thiol, a silane, a chlorosilane, an amine, an alcohol, a carbon acid, a siloxane or a dimethylamino silane.

8. The laser diode chip according to claim 1, wherein the number of layers in the reflection-increasing layer sequence or reflection-decreasing layer sequence ranges between 2 and 50.

9. The laser diode chip according to claim 8, wherein the number of layers in the reflection-increasing layer sequence or reflection-decreasing layer sequence ranges between 4 and 20.

* * * * *